(12) United States Patent  
Scott

(10) Patent No.: US 9,910,357 B2
(45) Date of Patent: *Mar. 6, 2018

(54) METHODS FOR FABRICATING TOOLING AND SHEETING

(71) Applicant: Orafol Americas Inc., Avon, CT (US)

(72) Inventor: Steven Scott, Avon, CT (US)

(73) Assignee: Orafol Americas Inc., Avon, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/701,040

(22) Filed: Apr. 30, 2015

(65) Prior Publication Data

US 2015/0234284 A1 Aug. 20, 2015

Related U.S. Application Data

(63) Continuation of application No. 13/428,882, filed on Mar. 23, 2012, now Pat. No. 9,050,762.

(51) Int. Cl.
*G02B 5/124* (2006.01)
*G03F 7/20* (2006.01)
*G03F 7/30* (2006.01)

(52) U.S. Cl.
CPC ........... *G03F 7/2059* (2013.01); *G02B 5/124* (2013.01); *G03F 7/30* (2013.01)

(58) Field of Classification Search
CPC ......... G03F 7/2059; G03F 7/30; G02B 5/124; G02B 5/3033; G02B 5/128;

(Continued)

(56) References Cited

U.S. PATENT DOCUMENTS 4,243,618 A 1/1981 Van Arnam
5,156,863 A 10/1992 Pricone et al.
(Continued)

FOREIGN PATENT DOCUMENTS

CN 1756648 A 4/2006
CN 102387915 A 3/2012
(Continued)

OTHER PUBLICATIONS

Lou et al., "Analysis and Fabrication of Corner Cube Array Based on Laser Direct Writing Technology," Applied Optics 49(29):5567-5574 (2010).

(Continued)

*Primary Examiner* — Frank Font
(74) *Attorney, Agent, or Firm* — LaClairRyan & Professional Corporation

(57) ABSTRACT

Methods for producing tooling and sheeting using laser writing techniques, and corresponding products thereof, are presented. In one embodiment, a seamless sheet having a plurality of microstructures formed in a continuous microstructured pattern is provided. In the methods described herein, a substrate having a photosensitive coating on a surface thereof is provided. A surface-relief microstructured pattern is produced in the photosensitive coating by selectively exposing the photosensitive coating to a beam of electromagnetic radiation. The exposed portions of the photosensitive coating are developed to form a microstructured pattern on the surface of the substrate. The microstructured pattern is then transferred into retroreflector tooling comprising the microstructured pattern on a surface thereof. A sheet containing the microstructured pattern on a surface thereof is then formed from the retroreflector tooling.

20 Claims, 11 Drawing Sheets

(58) Field of Classification Search
CPC ... B29D 11/00605; B05D 3/067; B29C 65/14; B29C 65/16; B29C 2035/0827
USPC ............. 359/529, 530, 546, 900; 156/272.2, 156/272.8, 275.5; 427/163.1, 163.4, 510
See application file for complete search history.

(56) References Cited

U.S. PATENT DOCUMENTS

| | | | |
|---|---|---|---|
| 6,021,559 | A | 2/2000 | Smith |
| 6,120,636 | A | 9/2000 | Nilsen et al. |
| 6,253,442 | B1 | 7/2001 | Benson et al. |
| 6,322,652 | B1 | 11/2001 | Paulson et al. |
| 6,410,213 | B1 | 6/2002 | Raguin et al. |
| 6,576,406 | B1* | 6/2003 | Jacobsen ............ G03F 1/14 118/218 |
| 6,620,576 | B2 | 9/2003 | Raguin |
| 6,967,053 | B1 | 11/2005 | Mullen et al. |
| 7,364,314 | B2 | 4/2008 | Nilsen et al. |
| 7,449,280 | B2 | 11/2008 | Johnson et al. |
| 7,618,564 | B2 | 11/2009 | Schilling et al. |
| 7,898,735 | B2* | 3/2011 | Moon ............ B01L 3/502707 359/566 |
| 8,316,764 | B1* | 11/2012 | Wu ................. B29D 11/0074 101/34 |
| 8,573,789 | B2 | 11/2013 | Smith |
| 8,637,226 | B2 | 1/2014 | Mazurek et al. |
| 2001/0032703 | A1* | 10/2001 | Paulson ............ B23K 9/035 156/304.6 |
| 2001/0048169 | A1 | 12/2001 | Nilsen et al. |
| 2002/0182547 | A1 | 12/2002 | Raguin |
| 2003/0227682 | A1 | 12/2003 | Sewall et al. |
| 2004/0135293 | A1 | 7/2004 | Umeki |
| 2005/0058948 | A1 | 3/2005 | Freese et al. |
| 2005/0112472 | A1 | 5/2005 | Kutsch et al. |
| 2005/0185279 | A1 | 8/2005 | Mullen et al. |
| 2010/0276076 | A1* | 11/2010 | McDonnell ............ B44C 3/02 156/247 |
| 2012/0021502 | A1* | 1/2012 | Mohanty ............ G01N 21/76 435/287.9 |
| 2012/0126458 | A1 | 5/2012 | King et al. |
| 2012/0140316 | A1 | 6/2012 | Suzuki et al. |
| 2012/0199994 | A1* | 8/2012 | Richert ............. B29C 39/148 264/1.35 |
| 2014/0029100 | A1 | 1/2014 | Smith |
| 2014/0036367 | A1 | 2/2014 | Smith |

FOREIGN PATENT DOCUMENTS

| | | |
|---|---|---|
| JP | 10-039124 | 2/1998 |
| JP | 2004-106320 | 4/2004 |
| JP | 2005-035119 | 2/2005 |
| JP | 2006-315347 | 11/2006 |
| JP | 2007-309960 | 11/2007 |
| WO | WO 2011020727 A1 | 2/2011 |

OTHER PUBLICATIONS

Office Action issued Mar. 29, 2016, in Chinese Patent Application No. 20121048226.7.
Translation of Japan Notice of Reasons for Rejection, corresponding JP Application No. 2012-213503 (dated Jul. 5, 2016).
European Search Report, corresponding EP Application No. 13151527.2-1703 (dated Aug. 9, 2016), pp. 1-10.

* cited by examiner

METHODS FOR FABRICATING TOOLING AND SHEETING

This application is a continuation of prior U.S. patent application Ser. No. 13/428,882, filed Mar. 23, 2012, which is herein incorporated by reference.

FIELD OF THE INVENTION

This technology relates generally to methods for the fabrication of retroreflective microstructures, and more particularly to the fabrication of retroreflector tooling and retroreflective sheeting comprising retroreflective microstructured patterns using laser-writing techniques. Laser writing can be used to fabricate large area, seamless retroreflective sheeting containing retroreflective microstructured patterns with geometries previously unobtainable with prior art methods of creating retroreflector tooling and retroreflective sheeting. This technology also relates to the resulting retroreflector tooling and retroreflective sheeting.

BACKGROUND OF THE INVENTION

Traditionally, retroreflective microstructures are fabricated using machining methods to create a master tool. Machining retroreflective microstructures often involves the use of a single-point diamond tooling to machine the microstructures onto a suitable blank substrate (see, e.g., U.S. Pat. No. 6,253,442). Flycutting or ruling is typically used to machine the substrate in order to achieve the levels of precision required for retroreflective sheeting specifications (see, e.g., U.S. Pat. No. 5,156,863). During the flycutting process, a high-speed spindle rotates the single-point diamond tool about an axis as the tool traverses along the linear axis of the machine tool. Using this method, cuts are made in the substrate from one side of the substrate to the other at a spacing based on the desired final geometry of the retroreflector. Significant drawbacks to the flycutting method include variations in the final master tool due to wear of the diamond tooling, disturbances in the pattern due to the machine tool, and the length of time required to cut the many grooves required to create the retroreflector.

Recent advances in machining technology include diamond machining retroreflectors on thin shims. These methods, however, are very time intensive, require precise machine tools, and often result in defects to the retroreflectors due to variations of the shims. In particular, variations in the size of shims create variations in height and gaps between the shims when the shims are stacked together for electroforming. These variations and gaps cause staining on the electroformed replicas. Diamond-machining retroreflectors on thin shims also has a disadvantage due to the fragile nature of the shims. Finally, there are limitations to the types of geometries that may be fabricated using this process.

Pin-bundling techniques have also been used to create retroreflective microstructures (see, e.g., U.S. Pat. No. 4,243,618). Pin-bundling techniques are similarly time intensive as the pins must be machined using single-point diamond tools and may result in variations resulting from the tooling and fixturing used. The machining of the pins further limits the geometries of the retroreflective microstructures that may be produced by this method. Staining and electroforming cosmetic issues are also a problem with this technique.

Further, typical methods of fabricating retroreflective microstructure tooling involve creating a master by electroforming and replicating that master many times into opposite generation electroforms. The multiple electroforms are tiled or parqueted together to create a finished tool of a large enough size to enable the production of retroreflective film. This process is time intensive and may take many months to years to complete depending on the complexity of the design and the size of the finished tool needed to make the sheeting.

As such, there is a need for a method of fabricating retroreflective microstructures in a more time efficient manner. There is also a need for a method of fabricating retroreflective microstructures that contain geometries that allow for enhanced optical features. Further, there is a need to provide retroreflector tooling that can create a continuous retroreflective sheeting that eliminates the need to tile or parquet multiple electroforms to create a finished tool of a large enough size to enable production of retroreflective film. This technology is directed to overcoming these and other deficiencies in the prior art.

SUMMARY OF THE INVENTION

This technology relates to a method for fabricating retroreflector tooling. This method involves providing a substrate having a photosensitive coating on at least one surface thereof. A surface-relief microstructured pattern is then produced in the photosensitive coating by selectively exposing the photosensitive coating to a beam of electromagnetic radiation. The exposed portions of the photosensitive coating are developed to form a retroreflective microstructured pattern on the surface of the substrate. The retroreflective microstructured pattern is then transferred into retroreflector tooling comprising the retroreflective microstructured pattern on a surface thereof.

This technology also relates to a method for fabricating retroreflective sheeting. This method involves providing a substrate having a photosensitive coating on at least one surface thereof. A surface-relief microstructured pattern is produced in the photosensitive coating by selectively exposing the photosensitive coating to a beam of electromagnetic radiation. The exposed portions of the photosensitive coating are developed to form a retroreflective microstructured pattern on the surface of the substrate. The retroreflective microstructured pattern is then transferred into a retroreflector tooling comprising the retroreflective microstructured pattern on a surface thereof. A retroreflective sheet containing the retroreflective microstructured pattern on a surface thereof is then formed from the retroreflector tooling.

This technology further relates to a retroreflective sheet made by the above method.

This technology also relates to a seamless retroreflective sheet comprising a plurality of retroreflectors with surfaces configured to retroreflect light, wherein the plurality of retroreflectors are formed in a continuous retroreflective microstructured pattern.

In accordance with this technology retroreflectors having the required surface finish and angles can be produced. A retroreflective sheet made by the methods of this technology may contain a retroreflective microstructured pattern comprising standard triangular or full-cube retroreflectors. The retroreflective sheet may contain a retroreflective microstructured pattern comprising multiple prism variations in a single sheet. For example, the retroreflective sheet may contain a retroreflective microstructured pattern that comprises variations in geometry, tilt, rotation, height, and size. These variations can be combined to make retroreflective sheeting with enhanced performance. The retroreflective sheet may comprise a large area seamless sheet with the retroreflective microstructured pattern on the surface thereof. In particular, this technology allows the formation of large-area retroreflectors without parqueting or tiling.

DETAILED DESCRIPTION OF THE INVENTION

This technology provides methods for fabricating retroreflector tooling and retroreflective sheeting containing retroreflective microstructured patterns.

Figure 1:
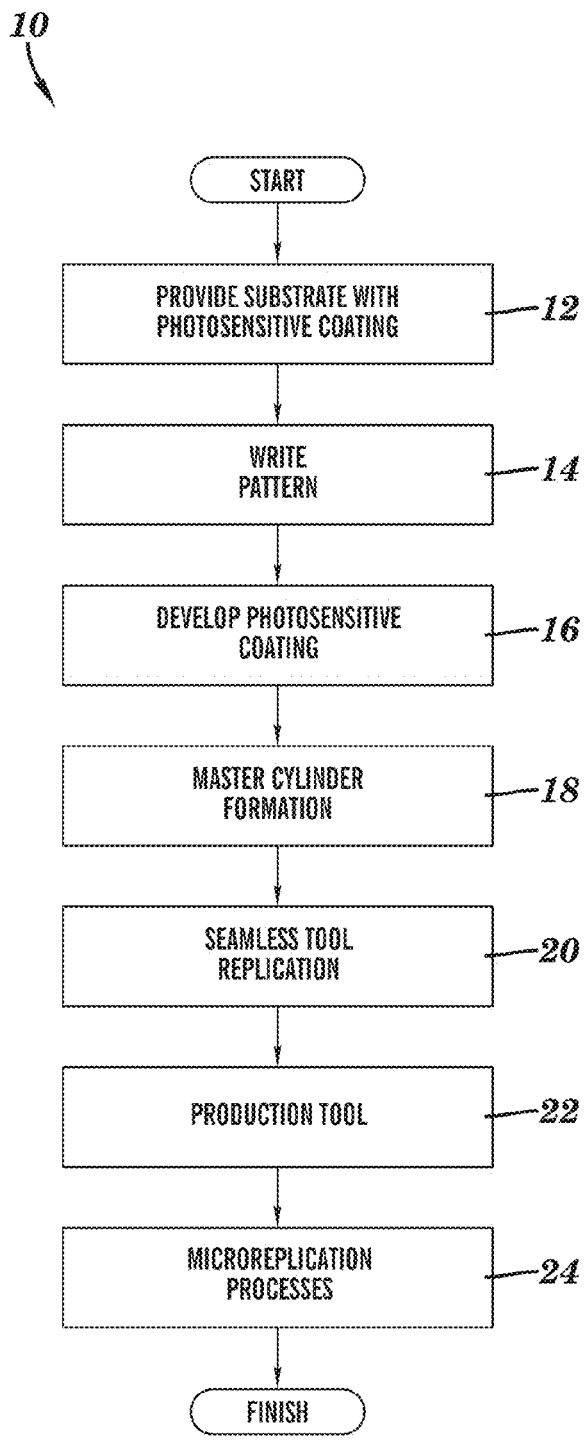
FIG. 1 is a functional block diagram illustrating a method of producing retroreflector tooling and retroreflective sheeting in accordance with certain embodiments of this technology.

Referring to FIG. 1, a method 10 for fabricating retroreflector tooling and retroreflective sheeting using laser writing or laser pattern generation (LPG) in accordance with one embodiment of this technology is illustrated. LPG provides a more time efficient method for creating the retroreflector tooling and sheeting. Additionally, LPG allows for the fabrication of retroreflective microstructured patterns having geometries not previously capable of being formed using techniques for forming retroreflective microstructured patterns known in the art. Further, LPG may be used to form tooling for the manufacture of large-area, seamless retroreflective sheeting.

At step 12, a substrate is provided having a photosensitive coating on at least one surface thereof. Suitable substrate materials include, but are not limited to, aluminum, steel, glass, and plastic cylinders. Suitable photosensitive coating materials include, but are not limited to, positive and negative photoresists. Methods for preparing a substrate with photosensitive material are disclosed, for example, in U.S. Pat. Nos. 6,410,213, 6,620,576, and 7,449,280, the teachings of which are fully incorporated herein by reference. A thin film of the photosensitive material can be coated on the substrate using techniques such as spin-coating, meniscus coating, dip coating, or spray coating, although other methods of coating photosensitive material on a substrate can be used. The photosensitive material can be photoresist suspended in a solvent solution, although other types of photosensitive material can be used. The thickness of the photosensitive coating is determined based on the needs of the intended application and desired microstructure depth and can be, for example, greater than 10 micrometers, or by way of another example from about 10 to 100 micrometers, with thicker coatings enabling the formation of larger structures such as retroreflectors having reduced diffractive effects.

At step 14, a surface-relief microstructured pattern is produced in the photosensitive coating by selectively exposing the photosensitive coating to a beam of electromagnetic radiation. In one embodiment, the beam of electromagnetic radiation is a laser beam. Techniques for laser writing are disclosed in U.S. Pat. Nos. 6,410,213 and 6,620,576, the teachings of which are fully incorporated herein by reference. The exposure may be varied in both time and degree of energy to form the surface-relief microstructured pattern. In particular, selectively exposing the photosensitive coating with varying degrees of energy results in the cross-linking of the photosensitive layer to varying depths, thereby creating the resultant microstructure. Alternatively, the photoresist can have the cross-linked bonds broken by the application of energy thereby creating the resultant microstructure after development.

At step 16, the exposed portions of the photosensitive coating are developed to form the retroreflective microstructured pattern on the surface of the substrate. The exposed portions of the substrate can be developed by submerging the substrate into an aqueous bath of developing solution, although other methods of developing the exposed photosensitive material can be used. The substrate is then immersed in a solution to remove the exposed photosensitive material and allowed to dry leaving only the retroreflective microstructured pattern on the surface of the substrate. The result is the formation of a master cylinder at step 18.

The retroreflective microstructured pattern may comprise full-cube retroreflectors or microprisms, as described, for example, in U.S. Reissue Pat. No. RE40455 and U.S. Pat. No. 6,253,442, which are hereby incorporated by reference in their entirety. The present invention provides a more time efficient method for creating both retroreflector tooling and retroreflective sheeting comprising full-cube retroreflectors. The full-cube retroreflectors provide higher theoretical efficiency than triangular retroreflectors. Theoretically, full-cube retroreflectors return close to 100% of the incident light at zero degrees where triangular retroreflectors return approximately 66% of the incident light at zero degrees.

Using the method described herein, the retroreflective microstructured pattern can be varied in design to include elements other than full-cube retroreflectors. By way of example, the retroreflective microstructured pattern may include triangular, hexagonal, pentagonal, or rectangular projected aperture retroreflectors, although other variations in design can be used. The design variations may be applied to individual retroreflectors within the retroreflective microstructured pattern or to groups of retroreflectors, or a combination of both.

The retroreflective microstructured pattern may further be produced to include multiple types of retroreflectors (i.e., multiple prism variations) on a single tool. The prism variations can include individual prisms with variations in size, tilt, cant, and rotation, although other variations in the prisms can be used. Prism variations may be applied to individual prisms within the retroreflective microstructured pattern or to groups of prisms, or to a combination of both. By varying the design and prism variations, the photometric performance of the end product can be specifically tailored.

This technology further allows for the production of retroreflective microstructured patterns that include other structures along with retroreflectors. The other structures may be optical or non-optical structures. By way of example, the retroreflective microstructured pattern may also include light directing prisms, lenses, lenticulars, standoffs, structural elements, flat areas for light transmission between elements, and radiuses, although other structures designed to produced desired effects can be used. The other structures, both optical and non-optical, can be written in groups or between individual retroreflectors, or a combination of both.

This technology may further produce a combination of the various design elements discussed above in the retroreflective microstructured pattern, although other design elements capable of being produced in the photosensitive coating may be contemplated. This technology allows for the production of retroreflective microstructured patterns that may be transferred to retroreflector tooling and retroreflective sheeting that have geometries that prior methods for creating retroreflector tooling and retroreflective sheeting, such as single-point diamond tooling or pin-bundling, were unable to produce (see, e.g., FIG. 5 and Example 1 discussed in detail below).

As shown in this embodiment in FIG. 1, a master cylinder is produced at step 18. Writing the retroreflective microstructured pattern on a drum or cylinder allows the formation of a continuous seamless tool as described in detail below. This also allows the formation of a continuous seamless retroreflective product. However, other master shapes may be used instead of a drum or cylinder.

At steps 20 and 22, the retroreflective microstructured pattern is transferred into a retroreflector tooling which includes the retroreflective microstructured pattern on a surface thereof. This typically involves first transferring the relief pattern of the photosensitive coating into a more durable medium. To transfer the pattern into metal, an electroforming process can be conducted. One can also etch-transfer the photosensitive material into the underlying substrate using a dry etching process such as reactive ion etching, ion milling, chemically assisted ion beam etching, or reactive ion beam etching. The etched substrate can be used to create replicas as embossing tooling or can be used as the final product itself.

In one embodiment, the cast-and-cure method is used and involves first creating a mold of the relief pattern of the photosensitive coating. The mold may be created by applying silicone to the outer surface of the first substrate, although other materials suitable for making a mold of the retroreflective microstructured pattern can be used. The mold is cured onto the substrate and then removed from the surface. In the event that the mold is made from cured silicone, the mold can be removed by raising the temperature of the silicone to take advantage of the high coefficient of expansion of silicone, although other methods of removing the mold from the first substrate can be used. The mold contains a negative copy of the retroreflective microstructured pattern of the photosensitive coating.

The mold may then be used to form retroreflector tooling. In order to electroform off the mold, a silver spray process can be used to create a thin conductive coating on the mold, although any method of creating an electroform can be used. The mold containing the thin conductive coating is then deposited in an aqueous bath to electrodeposit a metal coating on the areas of the mold coated with conductive material. A nickel bath can be used to create a nickel coating on the inner surface of the mold, although other suitable materials for producing retroreflector tooling may be used. The electroformed retroreflector tooling includes a positive copy of the retroreflective microstructure on a surface thereof and can be used as tooling in a casting or embossing process. The mold is then removed. The present invention provides a more time efficient method of creating retroreflector tooling. The present invention further allows for the production of retroreflector tooling containing retroreflective microstructured pattern geometries that prior methods for creating retroreflector tooling were unable to produce.

At step 24, the retroreflector tooling is used to form a retroreflective sheet containing the retroreflective microstructured pattern on a surface thereof. The retroreflective sheet may be formed by any method known in the art, including polymer replication or injection molding, although other methods of creating the retroreflective sheeting, such as embossing and UV casting can be used. In one embodiment, the sheeting may made from a curable resin, although the sheeting may be made of any other suitable material. Suitable materials include, but are not limited to polymeric epoxies, acrylics, polyester, polyurethane, polyurea, polycarbonate or the like and can be further selected to be transparent or non-transparent. The resin is poured on the tooling and then cured into solid form. The resin can be cured using ultraviolet radiation, although other methods of curing the resin such as e-beam curing can be used. The sheeting, once cured, is then removed from the tooling. The process creates a retroreflective sheet with the microstructures thereon. The present invention provides a more time efficient method of creating retroreflective sheeting. The present invention further allows for the production of retroreflective sheeting containing retroreflective microstructured pattern geometries that prior methods for creating retroreflector sheeting were unable to produce.

Figure 2:
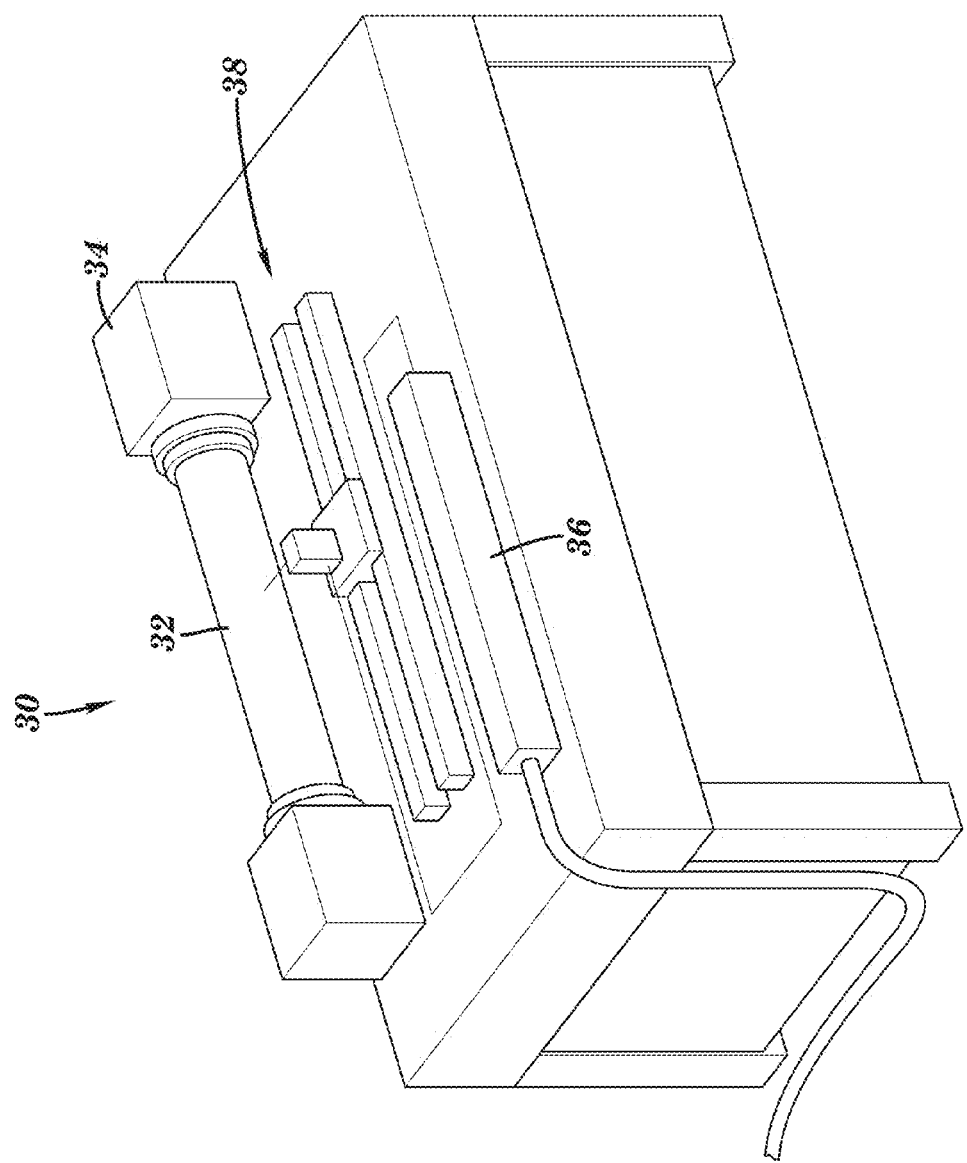
FIG. 2 is a schematic diagram of a drum laser writer used for the exposure of photosensitive material provided on a cylindrical drum or mandrel in accordance with this technology.

FIG. 2 illustrates a drum laser writer 30 (DLW) for use in the methods described above with reference to FIG. 1 to generate precise, free-form retroreflective microstructured patterns on a drum. In particular, the DLW 30 includes a master cylinder 32 which operatively rotates on a rotary axis 34. Laser 36 focuses a beam of electromagnetic radiation along the rotary axis 34 of the cylindrical drum 32. The laser 36 is located on a track 38 parallel to the rotary axis 34 of the cylindrical drum 26. The laser 36 operatively rasters along the track 38 to selectively expose the photosensitive coating on the master cylinder 32 along the rotary axis 34. The rotation of the master cylinder 32 and the movement of the laser 36 along the track 38 can be controlled such that the exposure occurs at submicron accuracy. Although in FIG. 2 the photosensitive coating is provided on a cylindrical drum or mandrel 32, substrates having other shapes can be used.

Figure 3:
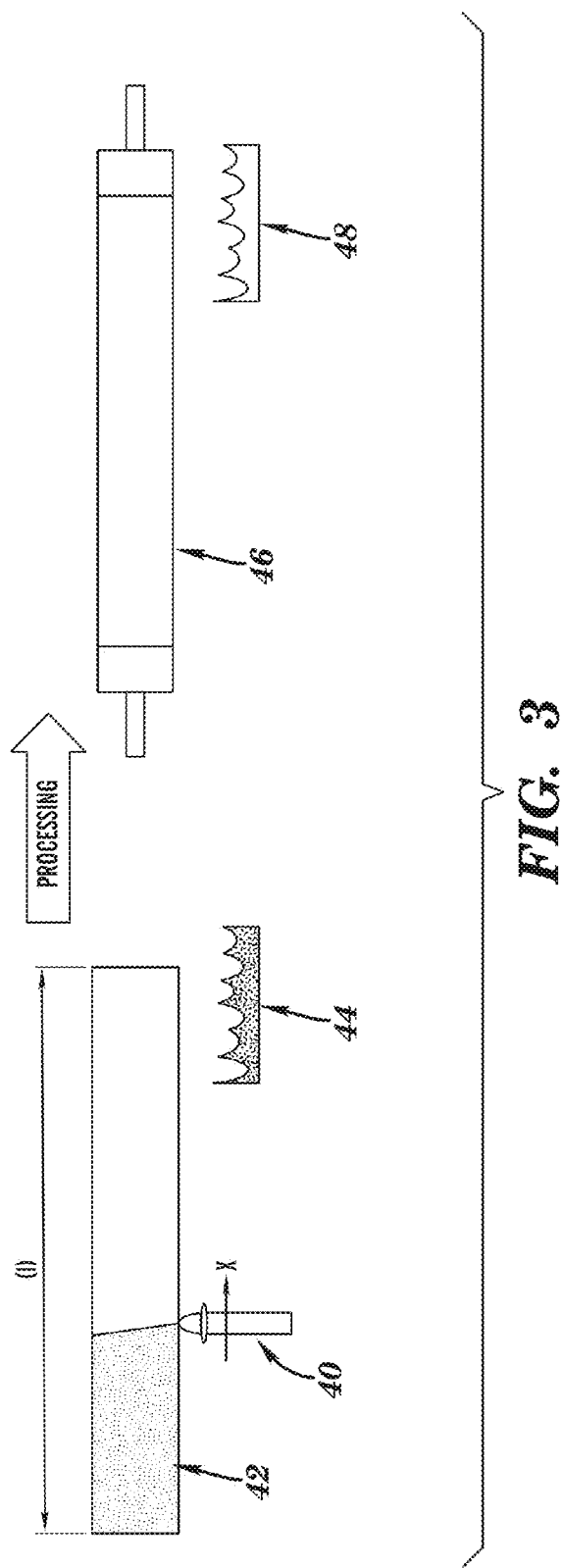
FIG. 3 is a process diagram of a method of producing a cylindrical retroreflector master and tooling in accordance with one embodiment of this technology.

Referring to FIG. 3, a process for producing a cylindrical retroreflector master and tooling in accordance with one embodiment of this technology is shown. In particular, a DLW as described above with reference to FIG. 2, is shown schematically as 40. The DLW 40 is used to generate the desired surface-relief retroreflective microstructured pattern in a photosensitive coating provided on a cylindrical substrate 42. The DLW 40 moves in the X direction while the drum rotates, for example, with a 1 micrometer advance along the drum per rotation of the drum. The cylindrical substrate 42 can be any desired length (l), for example, at least 1 meter. The microstructured pattern after development is shown as inset 44. After transferring, retroreflector tooling 46 is produced. The cross-section of the retroreflector tooling 46 is shown as inset 48.

Figure 4:
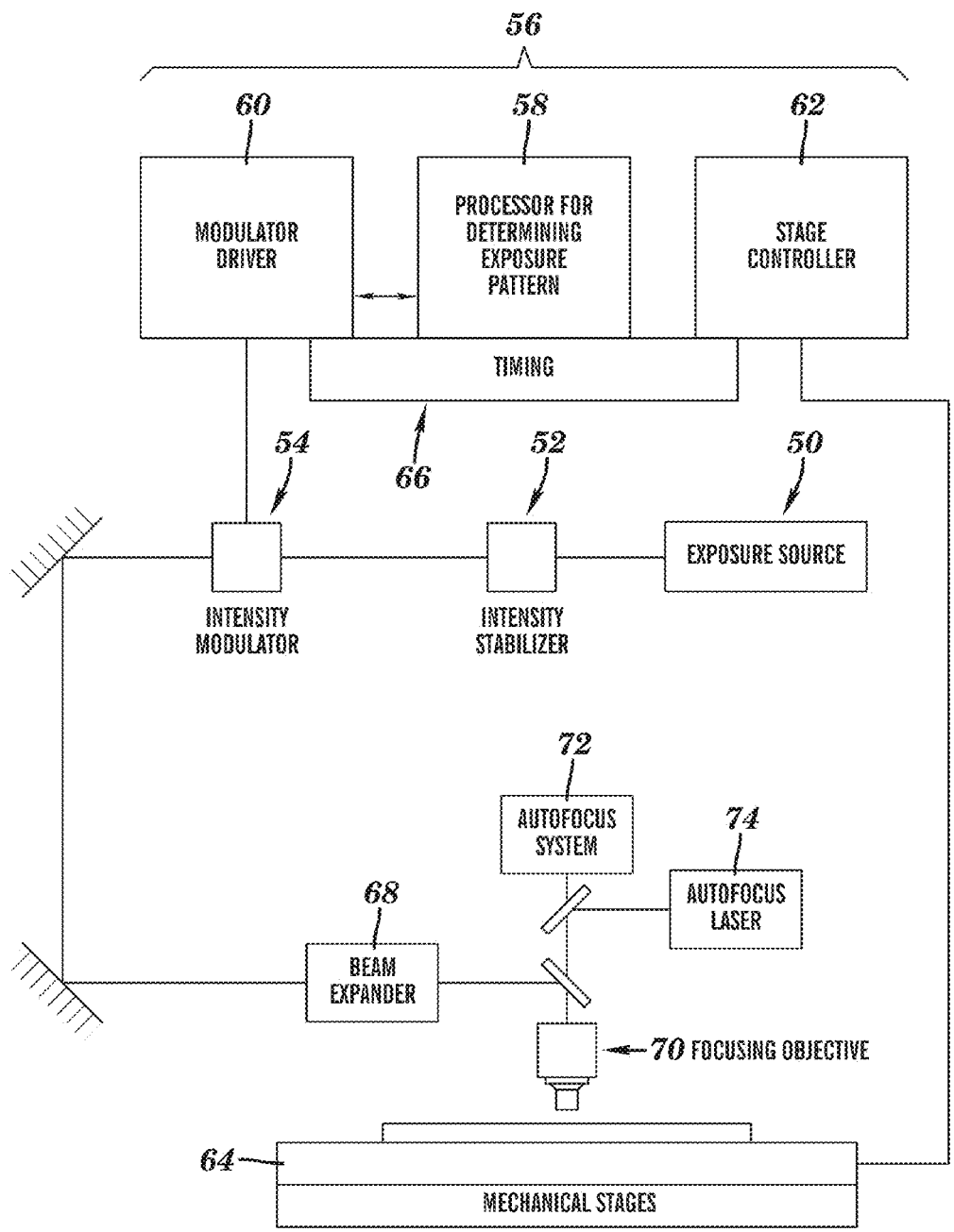
FIG. 4 is a flow diagram of a computer-controlled method for fabricating retroreflector tooling in accordance with one embodiment of this technology.

FIG. 4 illustrates a flow diagram of a computer-controlled method for producing a surface-relief retroreflective microstructured pattern on a photosensitive coating provided on a substrate by selectively exposing the photosensitive coating to a beam of electromagnetic radiation. The beam of electromagnetic radiation is provided by an exposure source 50. The exposure source 50 is typically a laser. The exposure source 50 may comprise any type of laser capable of producing the surface-relief microstructured pattern on the photosensitive coating. The exposure source 50 includes an intensity stabilizer 52 and intensity modulator 54, which can be an acoustopic modulator or an electro-optic modulator, to selectively expose the photosensitive material to varying degrees of electromagnetic radiation depending on the desired surface-relief pattern. Note that although a single beam is being illustrated passing through its own intensity modulator, a multi-beam geometry can be used to increase the writing speed.

With reference to FIG. 4, the LPG method of producing a surface-relief, retroreflective microstructured pattern on a coating of photosensitive material provided on a substrate disclosed herein can be implemented by a computer controlled system 56 using instructions for determining the surface-relief microstructured pattern implemented in hardware, firmware, or software. If implemented in software, the software may be stored on any form of computer readable medium, such as a random access memory (RAM) or a read-only memory (ROM) in the system or a floppy disk, hard disk, CD ROM, DVD ROM, or other computer readable medium which is read from and written to by a magnetic, optical, or other reading and writing system. The instructions for the LPG process can be based on a picture file describing the retroreflective microstructured pattern. By way of example, the LPG process can be based on a retroreflective microstructured pattern written as a bitmap file, although other types of files can be used to describe the desired retroreflective microstructured pattern.

In addition to a processor 58, the computer control system 56 also includes a modulator driver 60 and stage controller 62 for implementing the instructions for determining the surface-relief microstructured pattern. The modulator driver 60 controls the intensity modulator of the exposure source 50 and the stage controller 62 controls the position of a mechanical stage 64 which includes the substrate having a coating of photosensitive material provided thereon. Although the mechanical stage is shown as a planar stage in FIG. 4, it can be in the form of a master cylinder which operatively rotates on a rotary axis as shown in FIG. 2. The modulator driver 60 and stage controller 62 are under the control of a timing mechanism 66.

In this embodiment, the beam of electromagnetic radiation is directed through a series of elements including, but not limited to, a beam expander 68 and focusing objective 70 to direct the beam onto the substrate having a coating of photosensitive material provided thereon positioned on the stage 64. The focusing of the exposure source onto the substrate is monitored through the use of an autofocus source 74 and detector 72.

This technology also relates to a retroreflective sheet made by the above-described methods of the invention.

In one embodiment, this technology relates to a seamless retroreflective sheet comprising a plurality of retroreflectors with surfaces configured to retroreflect light, wherein the plurality of retroreflectors are formed in a continuous retroreflective microstructured pattern. As used herein, a continuous pattern means that there is no discontinuity in pattern between the individual retroreflectors, as in parqueting or tiling. The retroreflective sheet may be a large-area seamless sheet of from about 1 to about 2 meters wide and lengths limited only by the material roll lengths, typically about 200 to about 500 meters.

By way of example, the retroreflective microstructured pattern may include triangular, hexagonal, pentagonal, or rectangular retroreflectors. These patterns describe the geometry of the projection of the retroreflective microstructure's aperture. As described above, the retroreflective sheet may contain a retroreflective microstructured pattern comprising multiple prism variations, design variations, and other structures along with the retroreflectors, individually or in combination. Such variations may apply to individual retroreflectors, groups of retroreflectors, or a combination of both.

In one embodiment, the pluralities of retroreflectors include no vertical walls. For pin-bundle techniques, the resultant retroreflector has vertical walls due the machining process or the geometry of the prisms as they are assembled into the prism array. For parqueted or tiled arrays, the process for machining the edges of the prisms to piece together results in vertical surfaces. These vertical surfaces make replication of the pin-bundle or parqueted tooling difficult as electroforming usually requires a draft angle similar to the draft angles required for injection molding. Thus angles in retroreflective tooling under about three degrees from vertical increase the difficulty of replication and reduce the lifetime of the tooling due to the higher forces needed to separate the replications of the tooling. Tooling made with the LGP process can be designed and fabricated without any vertical walls.

Various coatings can be provided on the surfaces of the retroreflective sheet as described, for example, in PCT Publication No. WO 2005/114268, which is hereby incorporated by reference in its entirety.

Figure 5:
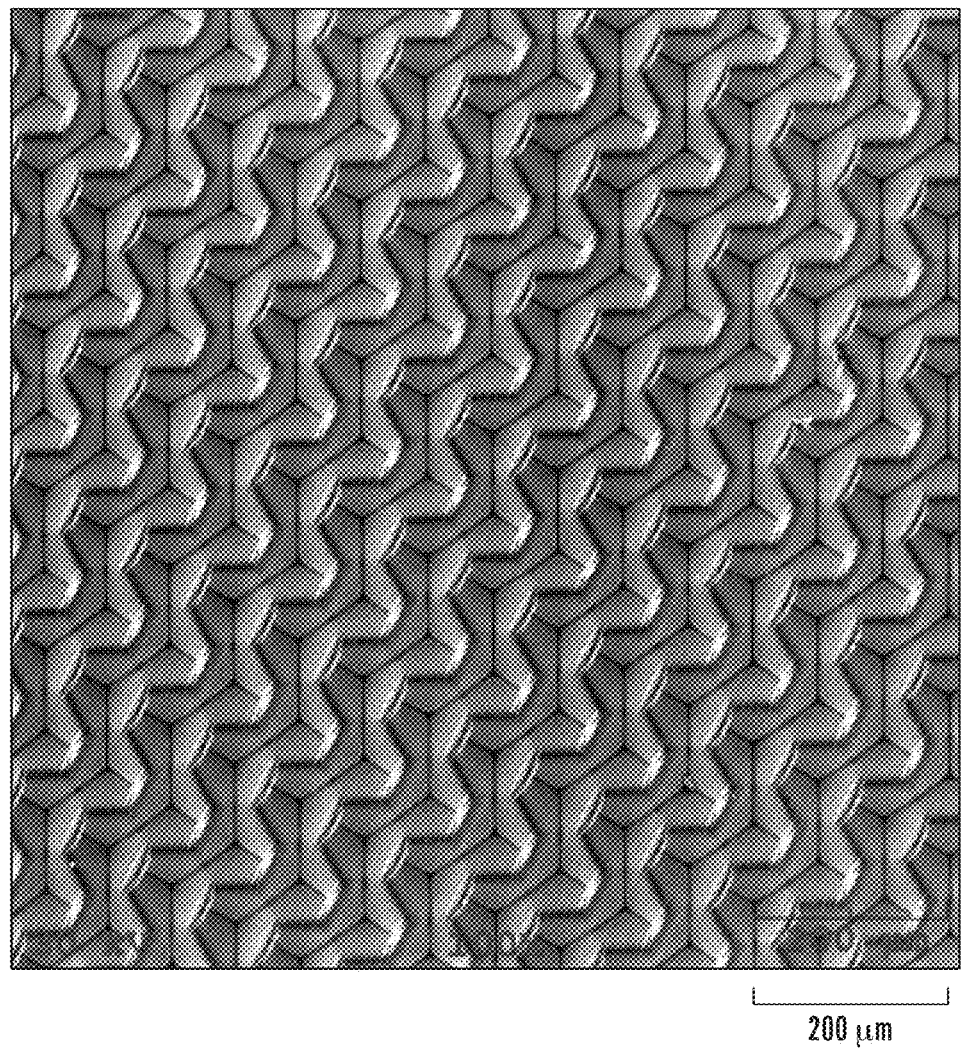
FIG. 5 is an image of retroreflector tooling made in accordance with one embodiment of this technology.
Figure 6A:
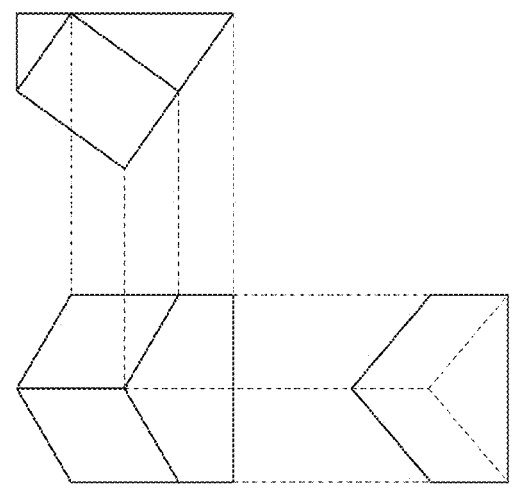
FIG. 6A is a schematic which shows triangular and pentagonal projected aperture retroreflectors in accordance with one embodiment of this technology.
Figure 6A:
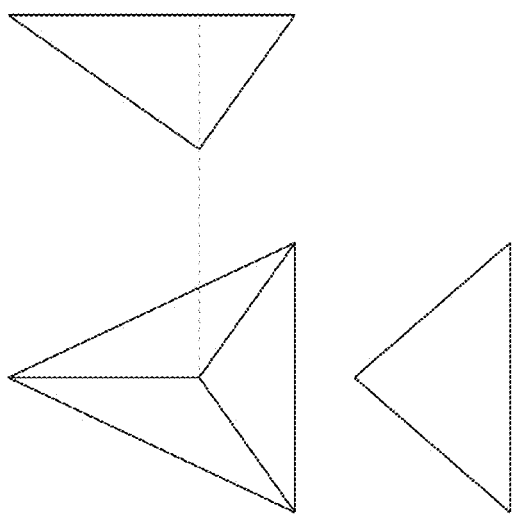
Figure 6B:
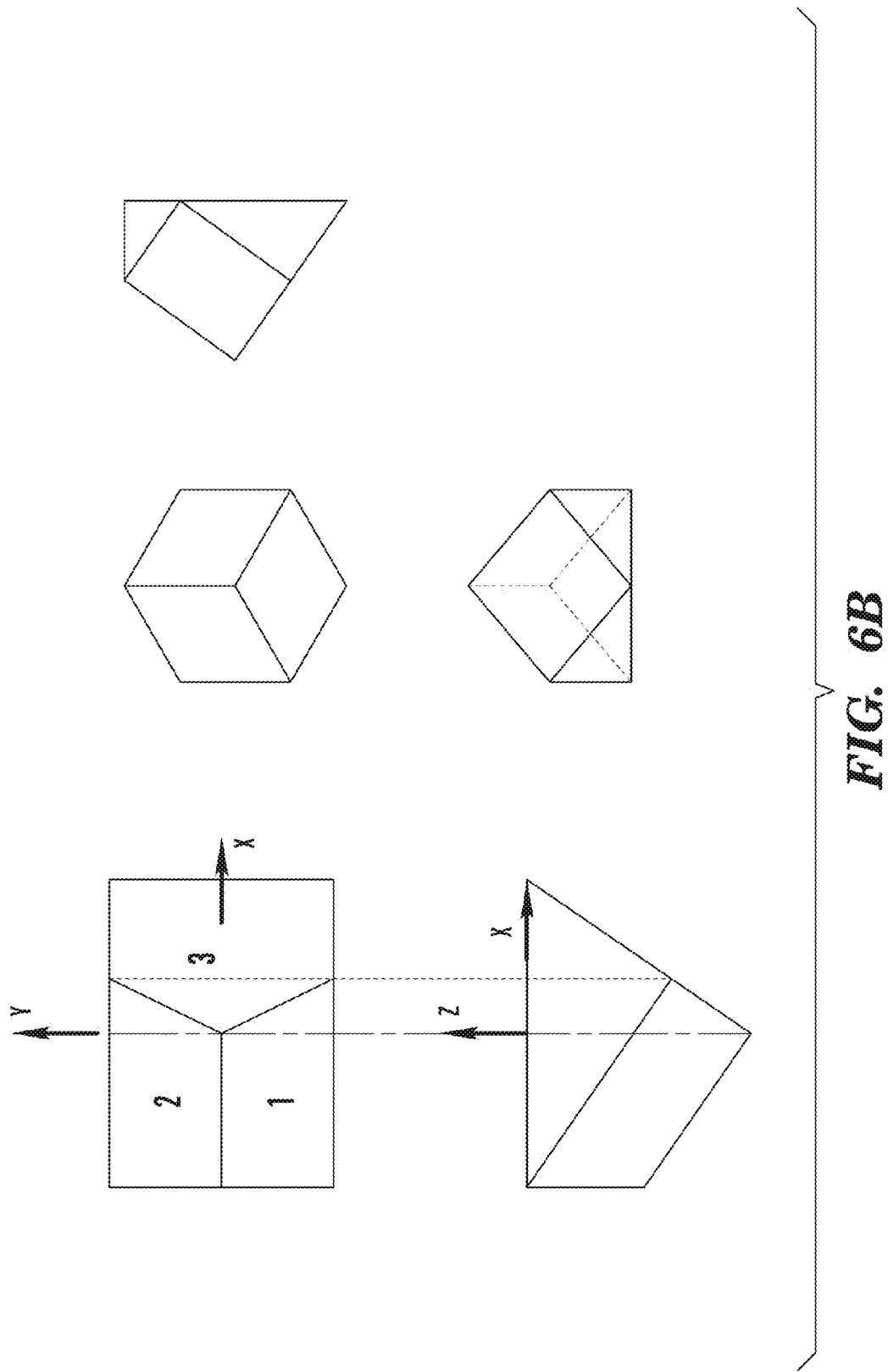
FIG. 6B is a schematic which shows rectangular and hexagonal projected aperture retroreflectors in accordance with one embodiment of this technology.
Figure 7B:
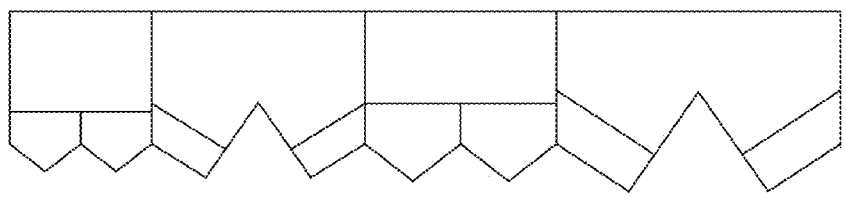
FIG. 7B is a cross-sectional view of the master of FIG. 7A.
Figure 7A:
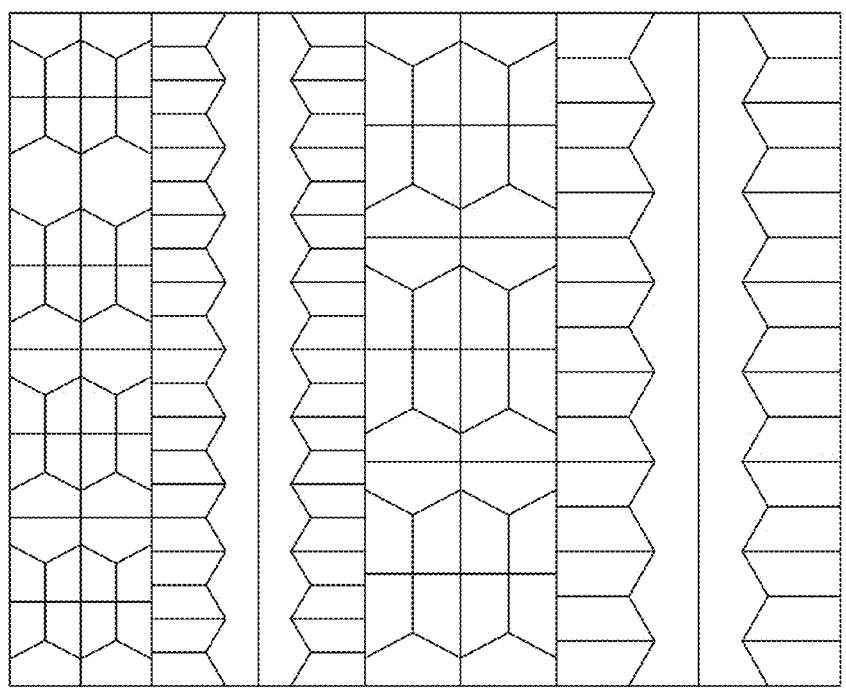
FIG. 7A is a top down view of a master including individual prisms with variations in tilt, rotation, height, and size in accordance with one embodiment of this technology.
Figure 8B:
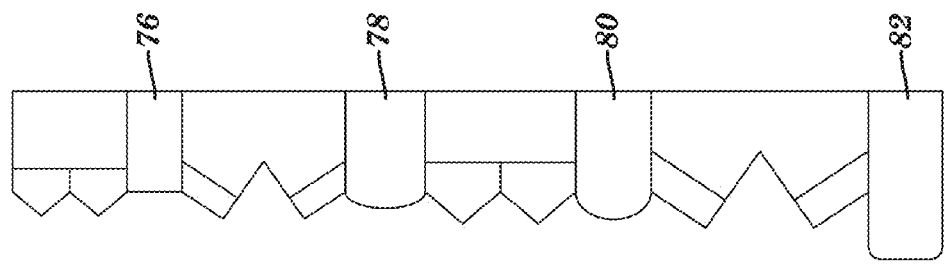
FIG. 8B is a cross-sectional view of the sheeting of FIG. 8A which shows flat areas 76, lenticulars 78, lenses 80, and stand-offs 82 between the four sets of prisms in accordance with one embodiment of this technology. The lenses 80 are characterized by radiuses on their surface.
Figure 8A:
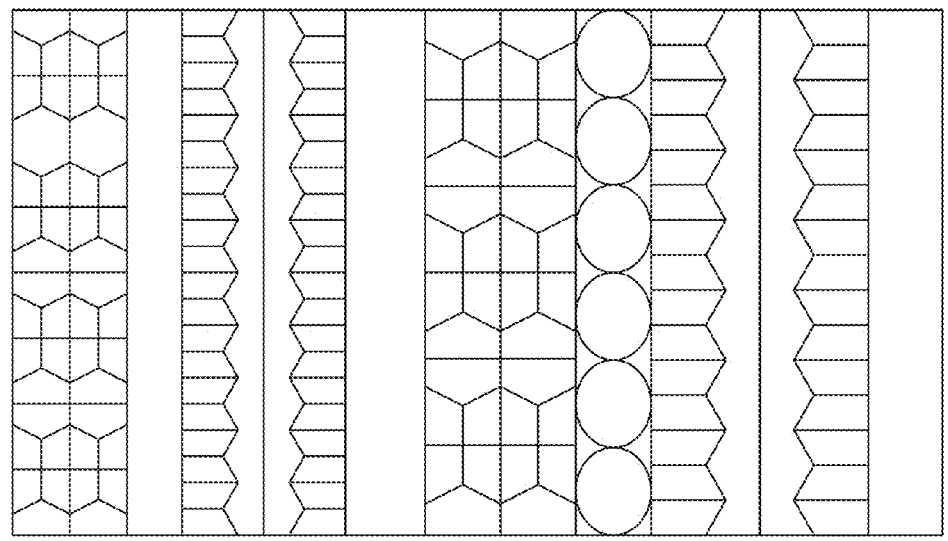
FIG. 8A is a top down view of a retroreflective sheeting in accordance with one embodiment of this technology including four sets of prisms.
Figure 9B:
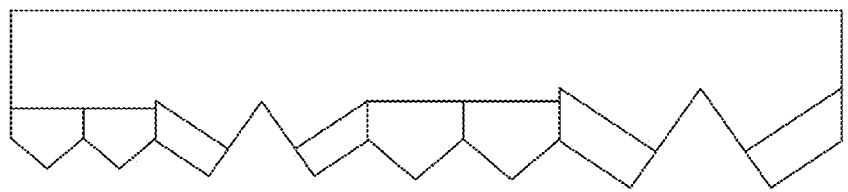
FIG. 9B is a cross-sectional view of the sheeting of FIG. 9A. The two V-shaped grooves illustrate channels running the length of the structure.
Figure 9A:
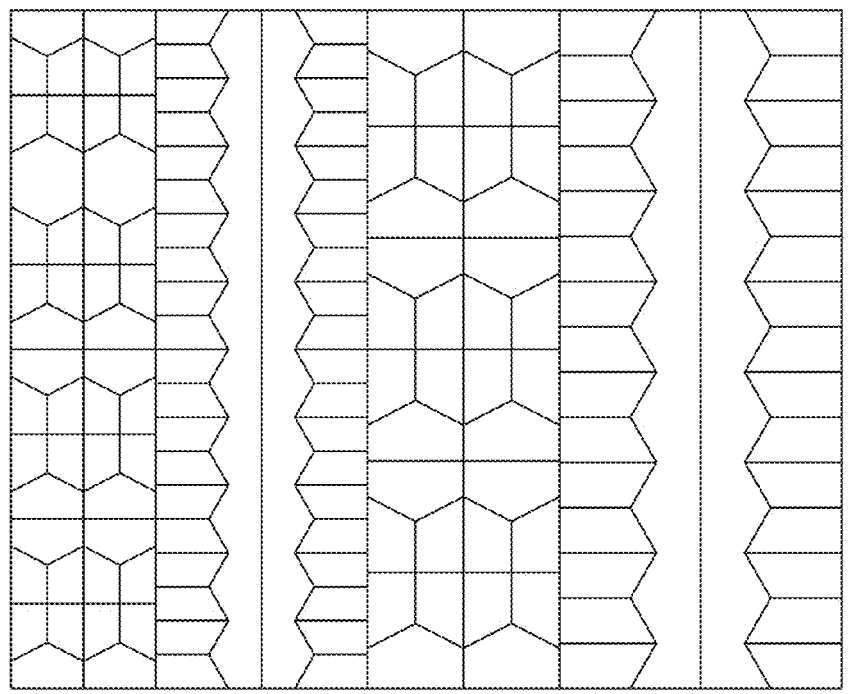
FIG. 9A is a top down view of a retroreflective sheeting including individual prisms with variations in tilt, rotation, height, and size in accordance with one embodiment of this technology.
Figure 10B:
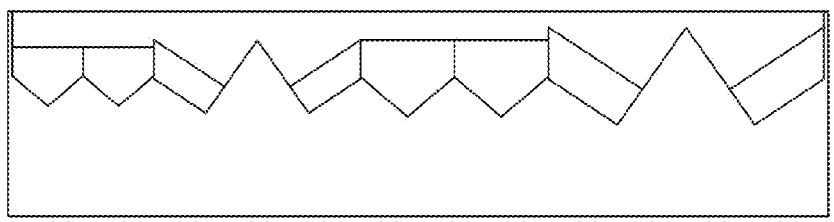
FIG. 10B is a cross-sectional view along line 10B of the tooling of FIG. 10A.
Figure 10A:
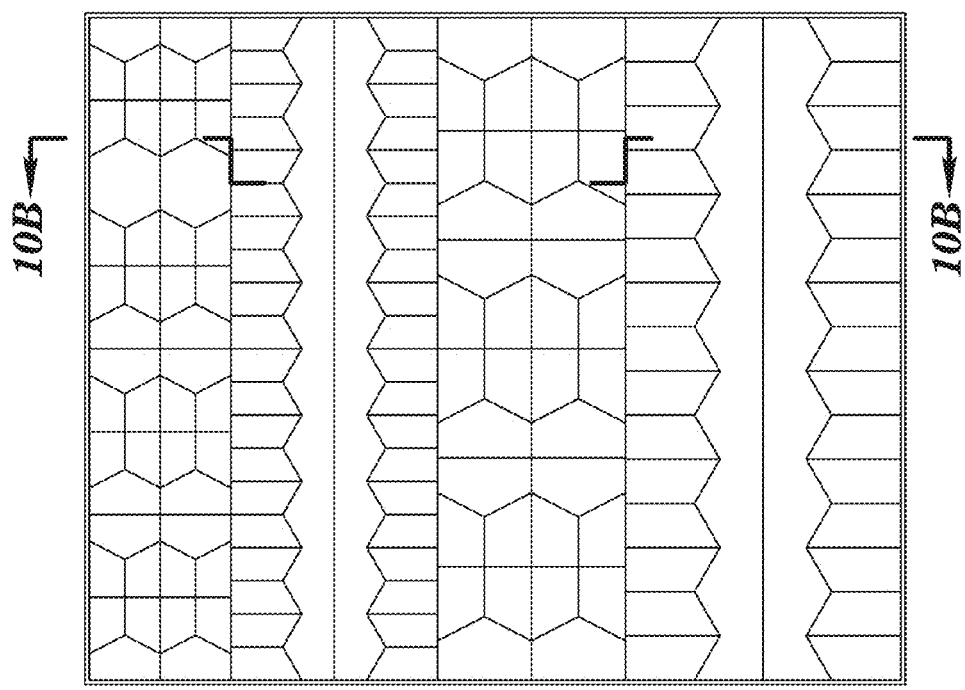
FIG. 10A is a top down view of retroreflector tooling including a retroreflective microstructured pattern in accordance with one embodiment of this technology.

FIG. 5 shows one example of a retroreflective microstructured pattern on retroreflector tooling made in accordance with the present technology that is unable to be produced by prior methods. The individual prisms are hexagonal prisms with each face of the retroreflector having five sides. With this layout, a mold made from this retroreflector tooling has material flow channels that will ease the manufacture of the retroreflective sheeting from the mold. As described above, retroreflective sheeting can be made from the retroreflector tooling by, for example, UV casting or embossing. These flow channels will speed the material production rates compared to the standard retroreflector geometry, which is a closed prism with no flow channels for the material during processing.

The use of LPG controlled by a computer system as shown in FIG. 4 allows for more time efficient production of retroreflective tooling or retroreflective sheeting containing retroreflective microstructured pattern geometries that prior methods for creating retroreflector tooling and sheeting were unable to produce. By way of example, the LPG generation process of the present technology can produce retroreflective microstructured patterns containing variations in design, multiple prism variations, and other optical and non-optical structures, all located on the same tooling or sheeting, individually or in combination. Moreover, retroreflective microstructured pattern geometry with no vertical walls can be produced, in contrast to prior techniques such as pin-bundling, where vertical walls are present in the retroreflector microstructures. LGP generated tooling can be completed in days rather than months as required to produce tooling using single-point diamond machining either for full-size tooling, pin bundle techniques, or shim-type mastering techniques.

Although LPG has been disclosed for fabrication of micro-optical structures such as lenses and gratings (see, e.g., U.S. Pat. Nos. 6,410,213 and 6,620,576, which are hereby incorporated by reference in their entirety), nowhere has the use of LPG for the fabrication of retroreflectors been disclosed. To function properly as a retroreflector, the individual prisms must have smooth surface finish, the angles between the faces of the prisms must be held to exacting angle tolerances, and the flatness of the retroreflective structure surface is critical. Previously, this was done with single-point diamond turning due to the accuracy of the angles able to be held with this process and the surface finish required to achieve high performance with the retroreflective film. With the processes developed as described herein, LPG has been shown to give the required accuracy of the angles, suitable surface finish of the faces, and the required flatness of the retroreflective structures for proper retroreflection of light. Previously, it was thought that the surface finish, flatness of the retroreflective structures, and the required angle geometry were not obtainable with photoresist generated structures.

The disclosed use of LPG wherein the surface-relief microstructured pattern is produced in a photosensitive coating provided on a cylindrical drum or mandrel provides particular advantages. More specifically, the method disclosed herein provides the creation of cylindrical retroreflector tooling or master. The cylindrical retroreflector tooling can be used for the time efficient production of large area, seamless retroreflective sheeting. The cylindrical retroreflector tooling allows for roll-to-roll volume manufacturing of retroreflective sheeting, although other methods of manufacturing retroreflective sheeting from a master can be used. This technique allows for large-area retroreflectors without the need to parquet various tooling together. The seamless nature of the retroreflective sheeting provides a more efficient, large-area, retroreflective surface. In addition, the seamless retroreflective sheeting of the present invention ensures that no discontinuity is present between the individual retroreflector microstructures, as with pin-bundle, parqueted, or tiled arrays of retroreflectors. Retroreflector geometries such as typical triangular or full-cube geometries can also be produced by the methods of the present technology.

EXAMPLES

Example 1

Preparation of Retroreflector Tooling

A retroreflector was designed that included the layout of an array of prisms in the format of FIG. 5. A bitmap file was generated to correspond to the height of the design: white being the topmost position in the design and black being the deepest or bottommost position in the design. The design was converted to a machine tool format by making every element of the design at a resolution of one micrometer equal to a power setting of the laser on the drum laser writer (DLW). In particular, the DLW was used to generate the surface-relief retroreflective microstructured pattern in a positive photoresist coating provided on a steel cylindrical substrate using a YAG laser. The drum was rotated and the laser power was modulated to expose the photoresist according to the design. After development of photoresist, the retroreflective microstructured pattern of FIG. 5 was obtained on the master cylinder. The master cylinder was cast in silicone. The silicone mold was then replicated using a silver spray and electroforming process to produce the seamless retroreflector tooling including the microstructured pattern of FIG. 5.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:
1. A method for fabricating tooling comprising:
providing a cylindrical substrate having a photosensitive coating on at least one surface thereof;
producing a surface-relief microstructured pattern in the photosensitive coating by selectively exposing the photosensitive coating to a beam of electromagnetic radiation;
developing the exposed portions of the photosensitive coating to form a microstructured pattern on the surface of the cylindrical substrate, wherein the microstructured pattern comprises individual elements with variations in tilt, rotation, height, or size; and
transferring the microstructured pattern into cylindrical tooling comprising the microstructured pattern on a cylindrical tooling surface.

2. The method of claim 1 wherein producing the surface-relief microstructured pattern comprises laser pattern generation.

3. The method of claim 2 wherein the laser pattern generation is controlled by a computer system based on a bitmap file loaded thereon.

4. The method of claim 1 wherein the microstructured pattern comprises lenses and at least one of lenticulars, stand-offs, structural elements, flat areas, prisms, or radiuses.

5. The method of claim 1 wherein producing the surface-relief microstructured pattern comprises rotating the cylindrical substrate as the beam of electromagnetic radiation selectively exposes the photosensitive coating along a rotary axis of the cylindrical substrate.

6. A method for fabricating sheeting comprising:
providing a cylindrical substrate having a photosensitive coating on a surface thereof;
producing a surface-relief microstructured pattern in the photosensitive coating by selectively exposing the photosensitive coating to a beam of electromagnetic radiation;
developing the exposed portions of the photosensitive coating to form a microstructured pattern on the surface of the cylindrical substrate, wherein the microstructured pattern comprises individual elements with variations in tilt, rotation, height, or size;
transferring the microstructured pattern into cylindrical tooling comprising the microstructured pattern on a cylindrical tooling surface; and
forming a seamless sheet containing the microstructured pattern on a surface thereof from the tooling.

7. The method of claim 6 wherein producing the surface-relief microstructured pattern comprises laser pattern generation.

8. The method of claim 7 wherein the laser pattern generation is controlled by a computer system having a bitmap file loaded thereon.

9. The method of claim 6 wherein the microstructured pattern comprises lenses and at least one of lenticulars, stand-offs, structural elements, flat areas, prisms, or radiuses.

10. The method of claim 6 wherein producing the surface-relief microstructured pattern comprises rotating the cylindrical substrate as the beam of electromagnetic radiation selectively exposes the photosensitive coating along a rotary axis of the cylindrical substrate.

11. A method for fabricating tooling comprising:
providing a cylindrical substrate having a photosensitive coating on at least one surface thereof;
producing a surface-relief microstructured pattern in the photosensitive coating by selectively exposing the photosensitive coating to a beam of electromagnetic radiation;
developing the exposed portions of the photosensitive coating to form a microstructured pattern on the at least one surface of the cylindrical substrate, wherein the microstructured pattern comprises lenses and at least one of lenticulars, stand-offs, structural elements, flat areas, prisms, or radiuses; and
transferring the microstructured pattern into cylindrical tooling comprising the microstructured pattern on a cylindrical tooling surface.

12. The method of claim 11 wherein producing the surface-relief microstructured pattern comprises laser pattern generation.

13. The method of claim 12 wherein the laser pattern generation is controlled by a computer system based on a bitmap file loaded thereon.

14. The method of claim 11 wherein producing the surface-relief microstructured pattern comprises rotating the cylindrical substrate as the beam of electromagnetic radiation selectively exposes the photosensitive coating along a rotary axis of the cylindrical substrate.

15. The method of claim 11 wherein the microstructured pattern comprises individual elements with variations in tilt, rotation, height, or size.

16. A method for fabricating sheeting comprising:
providing a cylindrical substrate having a photosensitive coating on a surface thereof;
producing a surface-relief microstructured pattern in the photosensitive coating by selectively exposing the photosensitive coating to a beam of electromagnetic radiation;
developing the exposed portions of the photosensitive coating to form a microstructured pattern on the surface of the cylindrical substrate, wherein the microstructured pattern comprises lenses and at least one of lenticulars, stand-offs, structural elements, flat areas, prisms, or radiuses;
transferring the microstructured pattern into cylindrical tooling comprising the microstructured pattern on a cylindrical tooling surface; and
forming a seamless sheet containing the microstructured pattern on a seamless sheet surface from the tooling.

17. The method of claim 16 wherein producing the surface-relief microstructured pattern comprises laser pattern generation.

18. The method of claim 17 wherein the laser pattern generation is controlled by a computer system based on a bitmap file loaded thereon.

19. The method of claim 16 wherein producing the surface-relief microstructured pattern comprises rotating the cylindrical substrate as the beam of electromagnetic radiation selectively exposes the photosensitive coating along a rotary axis of the cylindrical substrate.

20. The method of claim 16 wherein the microstructured pattern comprises individual elements with variations in tilt, rotation, height, or size.

* * * * *